(12) United States Patent
Cheng et al.

(10) Patent No.: US 9,209,065 B1
(45) Date of Patent: Dec. 8, 2015

(54) ENGINEERED SUBSTRATE AND DEVICE FOR CO-INTEGRATION OF STRAINED SILICON AND RELAXED SILICON

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Darsen D. Lu, Mount Kisco, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/483,907

(22) Filed: Sep. 11, 2014

(51) Int. Cl.
*H01L 21/331* (2006.01)
*H01L 21/762* (2006.01)
*H01L 21/02* (2006.01)

(52) U.S. Cl.
CPC .......... *H01L 21/762* (2013.01); *H01L 21/0228* (2013.01)

(58) Field of Classification Search
CPC .............. H01L 21/762; H01L 21/7607; H01L 21/0228; H01L 21/28079; H01L 21/28556; H01L 21/2022; H01L 21/3226; H01L 21/02381; H01L 21/045; H01L 27/1203; H01L 27/0922; H01L 27/3248; H01L 29/435; H01L 29/66045; C23C 16/277
USPC ......... 438/311, 197, 199, 207, 208, 222, 226, 438/240, 270, 298, 356, 357, 363, 423, 474, 438/475, 480, 679, 513, 618, 687, 688, 683, 438/752, 753, 769, 680; 257/E21.006, 257/E21.042, E21.051, E21.054, E21.077, 257/E21.092, E21.115, E21.126, E21.127, 257/E21.17, E21.227, E21.267, E21.288, 257/E21.311, E21.319, E21.32, E21.4, 257/E21.421, E21.545, E21.561, E21.632
See application file for complete search history.

(56) References Cited

U.S. PATENT DOCUMENTS

| | | | |
|---|---|---|---|
| 7,307,273 B2 * | 12/2007 | Currie | 257/18 |
| 7,335,545 B2 | 2/2008 | Currie | |
| 7,449,378 B2 * | 11/2008 | Chidambarrao et al. | 438/197 |
| 7,449,379 B2 | 11/2008 | Ochimizu et al. | |
| 7,495,266 B2 | 2/2009 | Isaacson et al. | |
| 7,525,154 B2 | 4/2009 | Nagano et al. | |
| 7,977,147 B2 | 7/2011 | Clifton | |
| 8,003,454 B2 | 8/2011 | Zhang et al. | |
| 8,106,381 B2 * | 1/2012 | Atanackovic | 257/22 |
| 2005/0186722 A1 | 8/2005 | Cheng et al. | |
| 2012/0068267 A1 | 3/2012 | Bedell et al. | |

\* cited by examiner

*Primary Examiner* — David Nhu
(74) *Attorney, Agent, or Firm* — Scully, Scott, Murphy & Presser, P.C.; Daniel P. Morris, Esq.

(57) ABSTRACT

A strained silicon material layer is bonded to a relaxed silicon material layer. The strained silicon material and any defect containing region formed during bonding are completely removed from a second device region, while a portion of the strained silicon material layer remains in a first device region. A relaxed silicon material portion is epitaxially formed on an exposed portion of the relaxed silicon material layer. A high performance nFET device, in which leakage is not a main concern, can be formed on the remaining portion of the strained silicon material layer in the first device region, and a pFET device or a low leakage nFET device can be formed on the epitaxially formed relaxed silicon material portion.

20 Claims, 7 Drawing Sheets

US 9,209,065 B1

ENGINEERED SUBSTRATE AND DEVICE FOR CO-INTEGRATION OF STRAINED SILICON AND RELAXED SILICON

BACKGROUND

The present application relates to semiconductor structures and methods of forming the same. More particularly, the present application relates to an engineered substrate containing a strained silicon material layer portion located on one region of a relaxed silicon material layer and a relaxed silicon material portion located on another region of the relaxed silicon material layer. The present application also relates to a semiconductor structure that contains one semiconductor device located at least partially on the strained silicon material player portion and another semiconductor device located at least partially on the relaxed silicon material portion. The present application also provides various methods for forming the aforementioned engineered substrate and the aforementioned semiconductor structure.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

In one example, and as CMOS technology is pushed to smaller device pitch, conventional strain engineering methods such as, for example, stress liners or embedded stressors are beginning to run out of steam. Substrate strain engineering is however independent of device pitch and thus has gained importance in the semiconductor industry.

Biaxially strained silicon with tensile silicon is known to benefit n-type field effect transistors (i.e., nFETs). Device data on bulk substrates, partially depleted semiconductor-on-insulator (SOI) substrates, extremely thin SOI substrates and non-planar substrates, i.e., semiconductor fins, show increased nFET performance on both strained silicon on silicon germanium or on a strained silicon germanium donor on insulator (SSDOI) substrate. One advantage of SSDOI substrates is that the donor silicon germanium layer can be reused to reduce cost due to lengthy silicon germanium epitaxy. Direct bonding of strained silicon on a relaxed silicon substrate is known, but leads to a defect interface that acts as a leakage path. As such, there is a continued need for providing engineered substrates that avoid the problems mentioned above.

SUMMARY

A strained silicon material layer is bonded to a relaxed silicon material layer. The strained silicon material and any defect containing region formed during bonding are then completely removed from a second device region, while a portion of the strained silicon material layer remains in a first device region. A relaxed silicon material portion is epitaxially formed on an exposed portion of the relaxed silicon material layer. A high performance nFET device in which leakage is not a main concern can be formed on the remaining portion of the strained silicon material layer in the first device region, and a pFET device or a low leakage nFET device can be formed on the epitaxially formed relaxed silicon material portion.

In one aspect of the present application, a method of forming a semiconductor structure is provided. In one embodiment, the method of the present application includes bonding an exposed surface of a strained silicon material layer to an exposed surface of a relaxed silicon material layer, wherein after bonding a defect containing region is present at an interface between the strained silicon material layer and the relaxed silicon material layer. The strained silicon material layer and the defect containing region formed during bonding are then completely removed from one device region, while a portion of the strained silicon material layer and the defect containing region remains in another device region. Next, a relaxed silicon material portion is epitaxially formed on an exposed portion of the relaxed silicon material layer in the one device region.

In another aspect of the present application, a semiconductor structure is provided. In one embodiment of the present application, the semiconductor structure includes a relaxed silicon material layer containing a first device region and a second device region, wherein the first device region is separated from the second device region by a trench isolation structure. A strained silicon material layer portion is located on a first portion of the relaxed silicon material layer in the first device region, wherein a defect containing region is present at an interface between the strained silicon material layer portion and the first portion of the relaxed silicon material layer. A relaxed silicon material portion is located on a second portion of the relaxed silicon material layer in the second device region, wherein the relaxed silicon material portion has an epitaxial relationship with the second portion of the relaxed silicon material layer and no defect containing region is present between the relaxed silicon material portion and the second portion of the relaxed silicon material layer.

DETAILED DESCRIPTION

Figure 1:
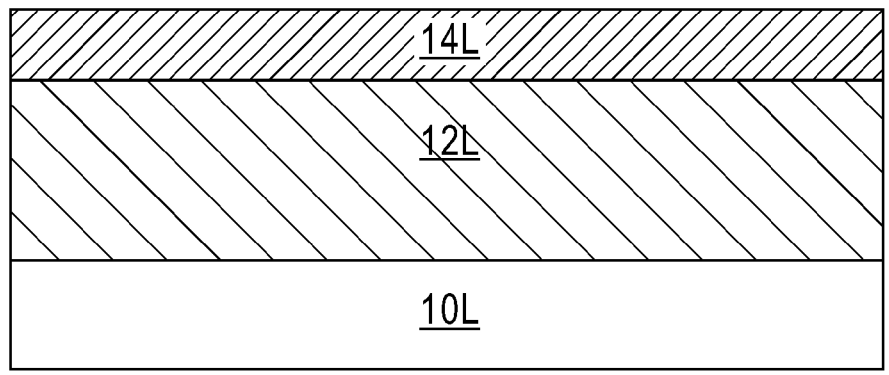
FIG. 1 is a cross-sectional view of an exemplary semiconductor structure including a material stack of, from bottom to top, a relaxed silicon material layer, a relaxed silicon germanium alloy material layer, and a strained silicon material layer that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a material stack of, from bottom to top, a relaxed silicon material layer 10L, a relaxed silicon germanium alloy material layer 12L, and a strained silicon material layer 14L that can be employed in one embodiment of the present application.

The exemplary semiconductor structure that is illustrated by FIG. 1 can be formed by first providing a relaxed silicon material layer 10L. The relaxed silicon material layer 10L can be a wafer that is formed utilizing standard techniques that are well known to those skilled in the art. The term "relaxed" as used throughout the present application denotes a material layer having no strain or a strain value of less than 0.3%. The thickness of the relaxed silicon material layer 10L can be from 5 nm to 30 nm. Other thickness that are lesser than or greater than the aforementioned thickness range are possible for the relaxed silicon material layer 10L.

The relaxed silicon germanium alloy material layer 12L is then formed on an exposed surface of the relaxed silicon material layer 10L. In one embodiment of the present application, the relaxed silicon germanium alloy material layer 12L may have a uniform, i.e., homogeneous, distribution of germanium throughout the entire layer. In another embodiment of the present application, the relaxed silicon germanium alloy material layer 12L may have a graded, i.e., non-homogeneous, distribution of germanium throughout the entire layer. In one example, the germanium content within the relaxed silicon germanium alloy material layer 12L may increase upwards from the interface that is formed with the underlying relaxed silicon material layer 10L, to the interface that is formed with the overlying strained silicon material layer 14L. In another example, the germanium content within the relaxed silicon germanium alloy material layer 12L may decrease upwards from the interface that is formed with the underlying relaxed silicon material layer 10L, to the interface that is formed with the overlying strained silicon material layer 14L.

In one embodiment of the present application, the relaxed silicon germanium alloy layer 12L is a graded (step graded or continuously graded) buffer layer with increasing germanium content, ending in a relaxed silicon germanium alloy material layer 12L as a top layer; only the relaxed silicon germanium alloy layer 12L is shown in the drawings for clarity. Typically, the relaxed silicon germanium alloy material layer 12L of such a buffer layer has a germanium content of from 20 atomic % to 30 atomic %. The thickness of the relaxed silicon germanium alloy material layer 12L can be from 5 nm to 30 nm. Other thickness that are lesser than or greater than the aforementioned thickness range are possible for the relaxed silicon germanium alloy material layer 12L.

The relaxed silicon germanium alloy material layer 12L can be formed utilizing an epitaxial growth, i.e., deposition process. The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. Thus, in this instance, the relaxed silicon germanium alloy material layer 12L has an epitaxial relationship, i.e., same crystal orientation, with the underlying relaxed silicon material layer 10L.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different source gases may be used for the deposition of the relaxed silicon germanium alloy material layer 12L. In some embodiments, the source gas for the deposition of the relaxed silicon germanium alloy material layer 12L includes a combination of a silicon containing gas source and a germanium containing gas source. Examples of a silicon source include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of a germanium source include germane, digermane, halogermane, dichlorogermane, trichlorogermane, tetrachlorogermane and combinations thereof. Carrier gases like hydrogen, nitrogen, helium and argon can be used.

Next, the strained silicon material layer 14L is provided on a surface of the relaxed silicon germanium alloy material layer 12L forming the material stack depicted in FIG. 1. The term "strained" denotes that the strained silicon material layer 14L has a stress associated therewith. In one embodiment of the present application, the strained silicon material layer 14L is a tensile strained silicon material.

The strained silicon material layer 14L can be formed on an exposed surface of the relaxed silicon germanium alloy material layer 12L by utilizing an epitaxial growth, i.e., deposition, process. Thus, the strained silicon material layer 14L has an epitaxial relationship with the underlying relaxed silicon germanium alloy material layer 12L. In some embodiments, a vacuum may be broken between the epitaxial growth of the relaxed silicon germanium alloy material layer 12L and the strained silicon material layer 14L. In other embodiments, a vacuum may be maintained between the epitaxial growth of the relaxed silicon germanium alloy material layer 12L and the strained silicon material layer 14L.

The epitaxial deposition of the strained silicon material layer 14L may include one of the various epitaxial growth process apparatuses mentioned above. The epitaxial deposition of the strained silicon material layer 14L may be performed utilizing the conditions mentioned above in forming the relaxed silicon germanium alloy material layer 12L and the strained silicon material layer 14L is formed utilizing one of the silicon sources mentioned above. Carrier gases like hydrogen, nitrogen, helium and argon can be used. The thickness of the strained silicon material layer 14L can be from 5 nm to 30 nm. Other thickness that are lesser than or greater than the aforementioned thickness range are possible for the strained silicon material layer 14L.

As is shown in FIG. 1, the relaxed silicon germanium alloy material layer 12L is contiguous layer that covers the entirety of the underlying relaxed silicon material layer 10L, and the strained silicon material layer 14L is a contiguous layer that covers the entirety of the underlying relaxed silicon germanium alloy material layer 12L.

Figure 2:
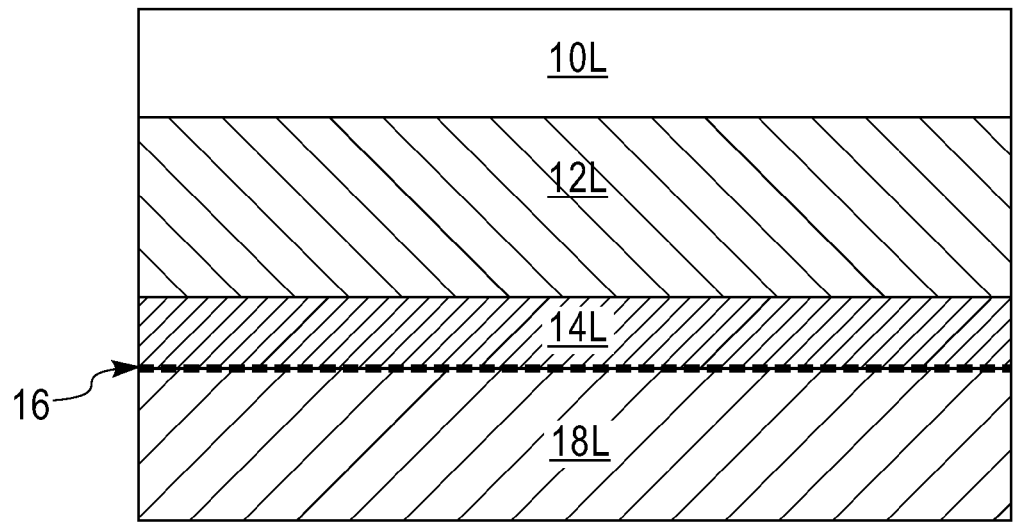
FIG. 2 is a cross-sectional view of the exemplary semiconductor structure of FIG. 1 after bonding an exposed surface of the strained silicon material layer of the material stack to an exposed surface of a relaxed silicon substrate.

Referring now to FIG. 2, there is illustrated the exemplary semiconductor structure of FIG. 1 after bonding an exposed surface of the strained silicon material layer 14L to an exposed surface of a relaxed silicon layer such as a relaxed silicon substrate 18L. The exemplary semiconductor structure of FIG. 2 includes, from bottom to, the relaxed silicon substrate 18L, the strained silicon material layer 14L, the relaxed silicon germanium alloy material layer 12L, and the relaxed silicon material layer 10L. As is shown, the relaxed silicon substrate 18L is a contiguous material that covers the entirety of the strained silicon material layer 14L.

The exposed surface of the strained silicon material layer 14L that is bonded to the exposed surface of the relaxed silicon substrate 18L is opposite a surface of the strained silicon material layer 14L that forms an interface with the relaxed silicon germanium alloy material layer 12L. During the bonding of the strained silicon material layer 14L to the relaxed silicon substrate 18L, and as a result of the difference in lattice constant between the strained silicon material layer 14L and the relaxed silicon substrate 18L, a defect containing region 16 including, for example, misfit location defects, forms at the interface between the strained silicon material layer 14L and the relaxed silicon substrate 18L.

In one embodiment of the present application, a direct bonding process can be employed. In a direct bonding process, bonding can be achieved by first bringing an exposed surface of the strained silicon material layer 14L into direct physical contact with an exposed surface of the relaxed silicon substrate 18L. Bonding continues by heating (i.e., annealing) the materials to a temperature from 700° C. to 1000° C. in an inert ambient such as, for example, He, Ne, Ar and mixtures thereof; the anneal aids in promoting a direct atomic bond between the strained silicon material layer 14L and the relaxed silicon substrate 18L. During the heating step, an externally applied force may be applied to ensure sufficient mating between the strained silicon material layer 14L and the relaxed silicon substrate 18L.

In some embodiments, the relaxed silicon substrate 18L may include a transfer substrate (not shown) which can be removed after the bonding process utilizing techniques well known to those skilled in the art.

In some embodiments and prior to contacting, exposed surfaces of the relaxed silicon substrate 18L and the strained silicon material layer 14L which will be eventually brought together and then bonded, may be treated prior to make them substantially hydrophobic. Provision of a hydrophobic surface can, prior to bonding, reduce or eliminate formation of an oxide on the layer surfaces. A hydrophobic surface can be obtained by, for example, treating the two surfaces in a hydrofluoric acid (HF) solution, for example, a 10% HF solution in water, by volume. A dip in a HF solution also can remove surface oxides.

In some embodiments and to remove organic material and/or particles from the surface of the relaxed silicon substrate 18L and the strained silicon material layer 14L, the relaxed silicon substrate 18L and the strained silicon material layer 14L can be treated in, for example, $3H_2OSO_4:1H_2O_2$ for 10 minutes, then in $50H_2O:1HF$ for 15 seconds, then in $6H_2O:1HCl:1H_2O_2$ for 15 minutes at 80° C., thus producing a hydrophilic surface. The two silicon surfaces (i.e., the relaxed silicon substrate 18L and the strained silicon material layer 14L) can then be treated in $10H_2O:1$ HF for 1 minute to remove surface oxide and bond fluorine to the surface, rendering the surface hydrophobic.

The thickness of the relaxed silicon substrate 18L can be from 5 nm to 30 nm. Other thickness that are lesser than or greater than the aforementioned thickness range are possible for the relaxed silicon substrate 18L.

Figure 3:
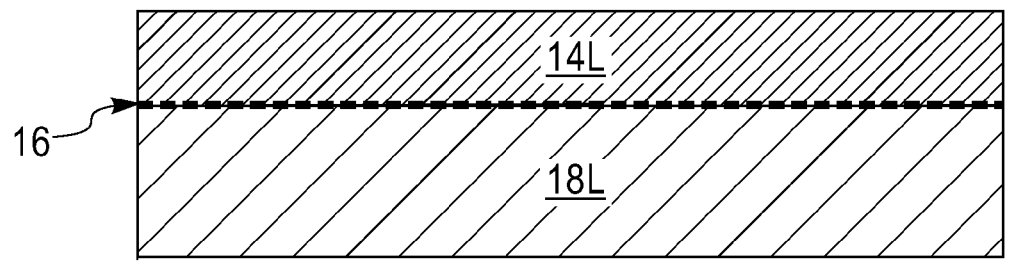
FIG. 3 is a cross-sectional view of the exemplary semiconductor structure of FIG. 2 after removing the relaxed silicon material layer and the relaxed silicon germanium alloy material layer to expose a surface of the strained silicon material layer.

Referring now to FIG. 3, there is illustrated the exemplary semiconductor structure of FIG. 2 after removing the relaxed silicon material layer 10L and the relaxed silicon germanium alloy material layer 12L to expose a surface of the strained silicon material layer 14L. When the relaxed silicon germanium alloy material layer 12L is a topmost layer of a buffer layer, the remaining portion of the buffer layer is also removed at this point of the present application. The surface of the strained silicon material layer 14L that is exposed by this step of the present application is opposite a surface of the strained silicon material layer 14L that forms a bonded interface with the relaxed silicon substrate 18L.

The relaxed silicon material layer 10L and the relaxed silicon germanium alloy material layer 12L can be removed by utilizing a material removal process such as, for example, grinding, etch back, Smart Cut® or any combination thereof. In one embodiment of the present application, the relaxed silicon material layer 10L and the relaxed silicon germanium alloy material layer 12L can be removed utilizing a same material removal process. In another embodiment of the present application, the relaxed silicon material layer 10L can be removed utilizing a first material removal process, while the relaxed silicon germanium alloy material layer 12L can be removed utilizing a second material removal process that is different from the first material removal process.

In one example, a KOH solution (e.g., 20 wt % KOH at a temperature from 65° C. to 80° C.) can provide removal of the relaxed silicon material layer 10L. The relaxed silicon germanium alloy material layer 12L can then be removed by a chemical etch in one of nitric acid, acetic acid, and dilute HF (e.g., $100H_2O:1$ HF).

After removing the relaxed silicon material layer 10L and the relaxed silicon germanium alloy material layer 12L, the exposed surface of the strained silicon material layer 14L can be subjected to a treating step such as those mentioned above to remove any contaminates or surface oxides therefrom.

Figure 4:
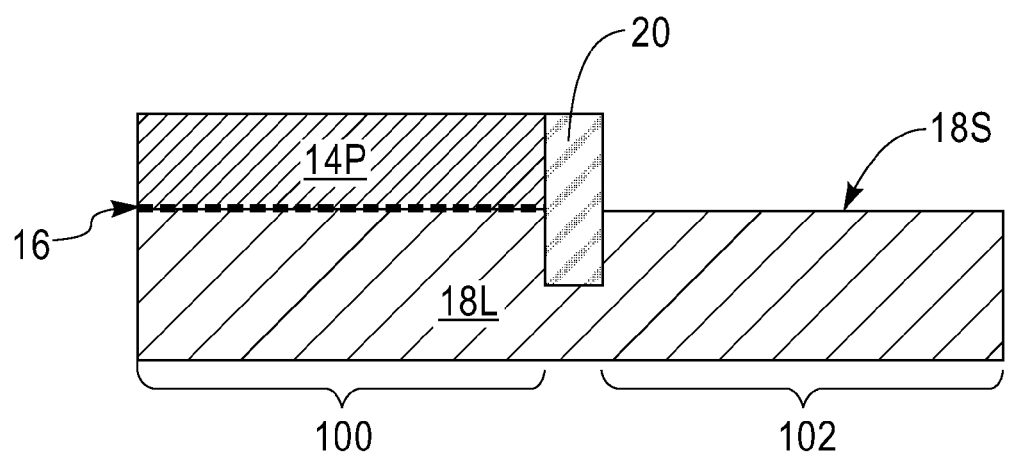
FIG. 4 is a cross-sectional view of the exemplary semiconductor structure of FIG. 3 after forming a trench isolation structure to define a first device region and a second device region, and removing the strained silicon material layer from the second device region.

Referring now FIG. 4, there is illustrated the exemplary semiconductor structure of FIG. 3 after forming a trench isolation structure 20 to define a first device region 100 and a second device region 102, and removal of the strained silicon material layer 14L from the second device region 102. In one embodiment of the present application, the trench isolation structure 20 is formed after the removal of the strained silicon material layer 14L from the second device region 102. In another embodiment of the present application, the trench isolation structure 20 is formed prior to the removal of the strained silicon material layer 14L from the second device region 102.

In one embodiment, the first device region 100 is a region in which a high performance nFET device can be subsequently formed. By "high performance nFET device" it is meant a FET with a leakage current usually greater than 10 nAmp/μm and a drive current greater than 1 mAmp/μm at an operating voltage of approximately 1V. In one embodiment, the second device region 102 is a region in which a pFET device which does not benefit from tensile strain can be subsequently formed on a regrown relaxed silicon material portion. In another embodiment, the second device region 102 is a region in which a low leakage nFET device can be fabricated. By "low leakage nFET" it is meant a FET having a leakage current less than 10 nAmp/μm, more preferably less than 1 nAmp/μm and a drive current greater than 1 mAmp/μm at an operating voltage of approximately 1V.

During the removal of the strained silicon material layer 14L from the second device region 102, the stained silicon material layer 14L is not removed from the first device region 100. The portion of the strained silicon material layer 14L that remains in the first device region 100 is now referred to as strained silicon material layer portion 14P. As is shown, the defect containing region 16 remains at the interface between the strained silicon material layer portion 14P and the original surface of the relaxed silicon substrate 18L.

The removal of the strained silicon material layer 14L from the second device region 102 also removes the defect containing region 16 from the second device region 102 and thus exposes a surface of the relaxed silicon substrate 18L that is free of the defect containing region 16. In the particular embodiment illustrated, a sub-surface of the relaxed silicon substrate 18L is exposed by this step of the present application. The exposed sub-surface of the relaxed silicon substrate 18L is labeled as 18S in the drawings of the present application. As is shown, the exposed sub-surface 18S of the relaxed silicon substrate 18L is vertically offset from, and is located beneath, the original surface of the relaxed silicon substrate 18L.

The trench isolation structure 20 can be formed utilizing a conventional trench isolation process well known to those skilled in the art. For example, lithography, etching and filling of a trench with a trench dielectric such as an oxide may be used in forming the trench isolation structure 20. Optionally, a liner may be formed in the trench prior to trench fill, a densification step may be performed after the trench fill and a planarization process may follow the trench fill as well. As is shown, the trench isolation structure 20 has a bottommost surface that is in contact with another sub-surface of the relaxed silicon substrate 18L. The another sub-surface, which defines the depth of the trench isolation structure 20, may be equal to or less than the sub-surface 18S. In the illustrated embodiment, the depth of the trench isolation structure 20 is greater than sub-surface 18S of the relaxed silicon substrate 18L that is exposed in the second device region 102. In some embodiments, and as shown, the trench isolation structure 20 has vertical sidewalls. In other embodiments (not shown), the trench isolation structure 20 may have tapered sidewalls.

After forming the trench isolation structure 20, a block mask (not shown) such as, for example, a photoresist material or oxide, can be formed protecting the strained silicon material layer 14L within the first device region 100, while leaving the strained silicon material layer 14L within the second device region 102 exposed (i.e., unprotected). An anisotropic etch can then be used to completely remove the exposed strained silicon material layer 14L within the second device region 102 as well as an underlying portion of the relaxed silicon substrate 18L. In one example, a KOH solution (e.g., 20 wt % KOH at a temperature from 65° C. to 80° C.) can be used to completely remove the exposed strained silicon material layer 14L within the second device region 102 as well as an underlying portion of the relaxed silicon substrate 18L. After the etch, the block mask can be removed utilizing techniques well known in the art providing the exemplary semiconductor structure shown in FIG. 4.

Figure 5:
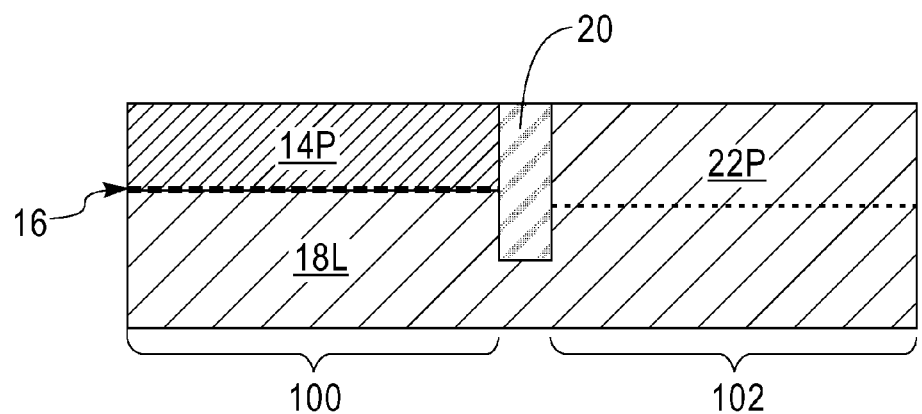
FIG. 5 is a cross sectional view of the exemplary semiconductor structure of FIG. 4 after providing a relaxed silicon material portion on an exposed sub-surface of the relaxed silicon substrate and within the second device region.

Referring now to FIG. 5, there is illustrated the exemplary semiconductor structure of FIG. 4 after providing a relaxed silicon material portion 22P on the exposed sub-surface 18S of the relaxed silicon substrate 18L and within the second device region 102. As is shown, the relaxed silicon material portion 22P has an uppermost surface that is coplanar with an uppermost surface of the trench isolation structure 20 and the strained silicon material layer portion 14P. As is further shown, the relaxed silicon material portion 22P has a bottommost surface that is vertically offset and located below a bottommost surface of the strained silicon material layer portion 14P.

The relaxed silicon material portion 22P is formed utilizing an epitaxial growth, i.e., deposition, process. Since an epitaxial growth process is used, the relaxed silicon material portion 22P has an epitaxial relationship, i.e., same crystal orientation, with the underlying semiconductor material layer, i.e., the sub-surface 18S of the relaxed silicon substrate 18L within the second device region 102. Moreover, since the relaxed silicon material portion 22P and the sub-surface 18S of the relaxed silicon substrate 18L are each composed of silicon, no material interface is formed between the two materials. In the drawings, the dotted line between the relaxed silicon material portion 22P and the sub-surface 18S of the relaxed silicon substrate 18L is merely provided for illustrative purposes. It is noted that strained silicon material layer portion 14P within the first device region 100 does not have an epitaxial relationship with that of the relaxed silicon substrate 18L. It is further noted that there is no defect containing region 16 present between the relaxed silicon material portion 22P and the sub-surface 18S of the relaxed silicon substrate 18L.

The epitaxial deposition of the relaxed silicon material portion 22P may include one of the various epitaxial growth process apparatuses mentioned above. The temperature for epitaxial deposition process for forming the relaxed silicon material portion 22P typically ranges from 550° C. to 900° C. Although higher temperature typically results in faster deposition, the faster deposition may result in crystal defects and film cracking.

A number of different source gases may be used for the deposition of the relaxed silicon material portion 22P. In some embodiments, the source gas for the deposition of the relaxed silicon material portion 22P includes a silicon containing gas source including any of the previously mentioned silicon sources. Carrier gases like hydrogen, nitrogen, helium and argon can be used.

In some embodiments of the present application, and following the epitaxial growth of the relaxed silicon material portion 22P, a planarization process such as, for example, chemical mechanical planarization and/or grinding may be used to provide the planar structure illustrated in FIG. 5.

FIG. 5 illustrates a semiconductor structure in accordance with an embodiment of the present application. Notably, the structure shown in FIG. 5 includes a relaxed silicon material layer (i.e., substrate 18L) containing a first device region 100 and a second device region 102, wherein the first device region 100 is separated from the second device region 102 by a trench isolation structure 20. A strained silicon material layer portion 14P is located on a first portion of the relaxed silicon material layer (i.e., substrate 18L) in the first device region 100, wherein a defect containing region 16 is present at an interface between the strained silicon material layer portion 14P and the first portion of the relaxed silicon material layer 18L. A relaxed silicon material portion 22P is located on a second portion of the relaxed silicon material layer (i.e., substrate 18L) in the second device region 102, wherein the relaxed silicon material portion 22P has an epitaxial relationship with the second portion of the relaxed silicon material layer 18L and no defect containing region is present between the relaxed silicon material portion 22P and the second portion of the relaxed silicon material layer (i.e., substrate 18L).

Figure 6:
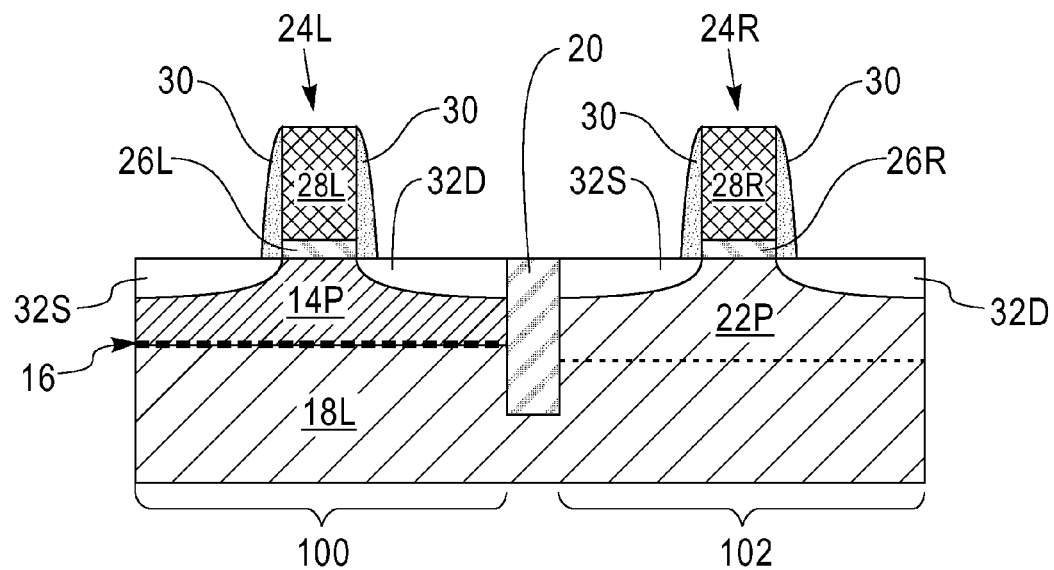
FIG. 6 is a cross sectional view of the exemplary semiconductor structure of FIG. 5 after forming an nFET device within the first device region and on the strained silicon material layer portion, and forming a pFET device within the second device region and on the relaxed silicon material portion using a gate first process.

Referring now to FIG. 6, there is illustrated the exemplary semiconductor structure of FIG. 5 after forming an nFET device 24L within the first device region 100 and on the strained silicon material layer portion 14P, and forming a pFET device 24R within the second device region 102 and on the relaxed silicon material portion 22P using a gate first process. Although a pFET device is described and illustrated as being formed in the second device region 102, it is possible to form a low leakage nFET device on the relaxed silicon material portion 22P and in the second device region 102.

In a gate first process, functional gate structures are formed directly on the surface of the substrate prior to forming the source and drain regions. The term "functional gate structure" is used throughout the present application as a permanent gate structure used to control output current (i.e., flow of carriers in the channel) of a semiconducting device through electrical or magnetic fields.

The nFET device 24L includes a functional gate structure that includes a gate dielectric material portion 26L and a gate conductor portion 28L, while the pFET device (or low leakage nFET device) 24R includes another functional gate structure that includes another gate dielectric material portion 26R and another gate conductor portion 28R.

Each gate dielectric material portion 26L, 26R that can be used in the present application can be a same or different gate dielectric material. The gate dielectric material that provides each gate dielectric material portion 26L, 26R can be a semiconductor oxide, a semiconductor nitride, and/or a semiconductor oxynitride. In one example, the gate dielectric material that provides each gate dielectric material portion 26L, 26R can be composed of silicon dioxide, silicon nitride and/or silicon oxynitride. In another embodiment of the present application, the gate dielectric material that provides each gate dielectric material portion 26L, 26R may include at least a dielectric metal oxide. Exemplary dielectric metal oxides that can be used as the gate dielectric material that provides each gate dielectric material portion 26L, 26R include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material that provides each gate dielectric material portion 26L, 26R.

In some embodiments of the present application, the gate dielectric material that provides each gate dielectric material portion 26L, 26R can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides each gate dielectric material portion 26L, 26R can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material that provides each gate dielectric material portion 26L, 26R can have a thickness in a range from 1 nm to 10 nm. Other thicknesses that are lesser than or greater than the aforementioned thickness range can also be employed for the gate dielectric material that provides each gate dielectric material portion 26L, 26R.

Each gate conductor portion 28L, 28R may comprise a same or different conductive material. Examples of conductive materials that can provide each gate conductor portion 28L, 28R include, but are not limited to, doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the conductive material that provides each gate conductor portion 28L, 28R is comprised of a doped polysilicon or doped polysilicon germanium. In another embodiment, a lower portion of the conductive material that provides each gate conductor portion 28L, 28R is comprised a conductive material other than doped polysilicon or doped polysilicon germanium, and an upper portion of the conductive material that provides each gate conductor portion 28L, 28R is comprised of doped polysilicon or doped silicon germanium.

The conductive material that provides each gate conductor portion 28L, 28R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the conductive material that provides each gate conductor portion 28L, 28R has a thickness from 1 nm to 100 nm. Other thicknesses that are lesser than or greater than the aforementioned thickness range can also be employed for the conductive material that provides each gate conductor portion 28L, 28R.

Each functional gate structure can be formed by first providing a material stack of, from bottom to top, a gate dielectric material and a conductive material. In some embodiments, block mask technology may be used to form different gate dielectric materials and/or conductive materials within the various device regions. Following the formation of the material stack, the material stack can be patterned by lithography and etching. Lithography can include forming a photoresist (not shown) on the topmost surface of the conductive material of the material stack, exposing the photoresist to a desired pattern of radiation, and then developing the exposed photoresist with a resist developer to provide a patterned photoresist atop the material stack. At least one etch is then employed which transfers the pattern from the patterned photoresist into the various materials of the material stack. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing.

After patterning the material stack, a functional gate structure including gate dielectric material portion 26L, 26R and a gate conductor portion 28L, 28R is formed. In some embodiments, and as is illustrated, the sidewall edges of the gate dielectric material portion 26L, 26R and the gate conductor portion 28L, 28R are vertically coincident to (i.e., vertically aligned with) each other.

Next, a spacer 30 can be formed on each sidewall of each functional gate structure. After spacer formation, a source region 32S is formed in one portion of the strained silicon material layer portion 14P on one side of the functional gate structure within the first device region 100 and a drain region 32D can be formed in another portion of the strained silicon material layer portion 14P on another side of the functional gate structure formed in the first device region 100. Within the second device region, a source region 32S is formed in one portion of the relaxed silicon material portion 22P on one side of the functional gate structure within the second device region 102 and a drain region 32D can be formed in another portion of the relaxed silicon material portion 22P on another side of the functional gate structure formed in the second device region 102. The semiconductor portion (i.e., either strained silicon or relaxed silicon) that is located beneath each functional gate structure and positioned between the source region 32S and the drain region 32D is referred as a channel region.

The spacer 30 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the spacer 30 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

In some embodiments (not shown), a source extension region and drain extension region are typically formed prior to forming the spacer 30 utilizing an extension ion implantation process. As such, a portion of each of the source extension region and drain extension region would be located beneath the spacer 30. After forming the spacer 30, source regions 32S and drain region 32D are formed utilizing a source/drain ion implantation process. An activation anneal may follow the implantation processes.

Each source region 32S (including the corresponding source extension region) and each drain region 32D (including the corresponding drain extension region) may be doped with a p-type or n-type dopant. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate examples of n-type dopants, i.e., impurities, include, but are not limited to, antimony, arsenic and phosphorous. The concentration of dopants within each source region 32S (and corresponding source extension region) and each drain region 32D (and the corresponding drain extension region) can be within ranges typically used in forming metal oxide semiconductor field effect transistors (MOSFETs).

Figure 7:
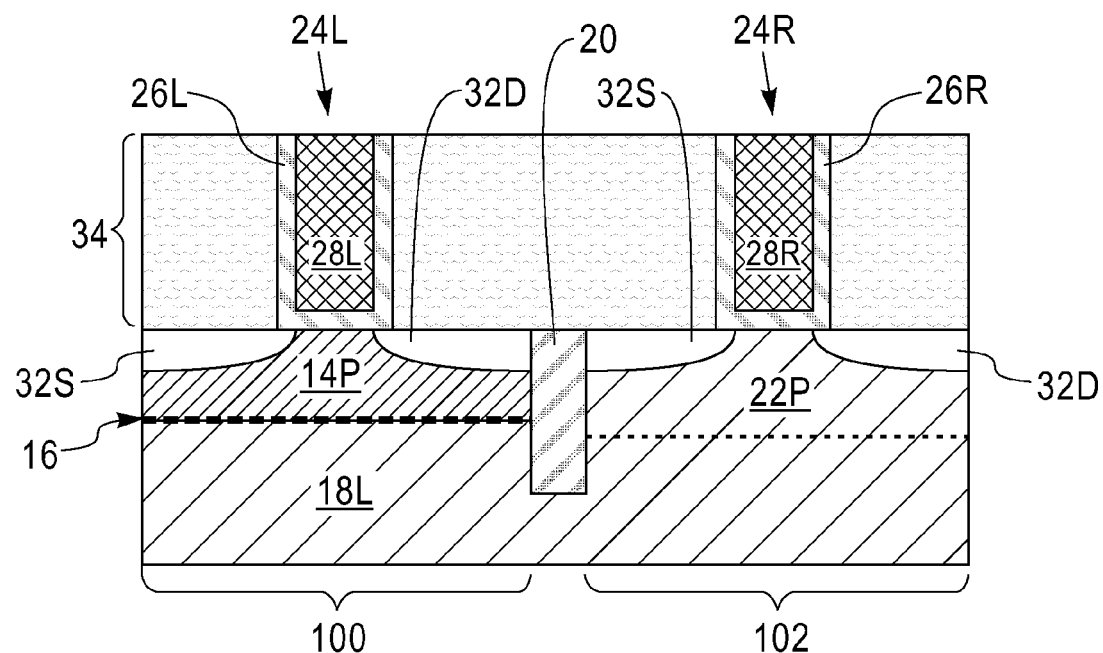
FIG. 7 is a cross sectional view of the exemplary semiconductor structure of FIG. 5 after forming an nFET device within the first device region and on the strained silicon material layer portion, and forming a pFET device within the second device region and on the relaxed silicon material portion using a gate last process.

Referring now to FIG. 7, there is illustrated the exemplary semiconductor structure of FIG. 5 after forming an nFET device 24L within the first device region 100 and on the strained silicon material layer portion 14P, and forming a pFET device 24R within the second device region 102 and on the relaxed silicon material portion 22P using a gate last process. Although a pFET device is described and illustrated as being formed in the second device region 102, it is possible to form a low leakage nFET device on the relaxed silicon material portion 22P and in the second device region 102.

In a gate last process, functional gate structures are formed on the surface of the substrate after formation of the source and drain regions. In such an embodiment, sacrificial gate structures (not shown) are first formed on the substrate. Next, a spacer can be optionally formed on sidewalls of each sacrificial gate structure. The source and drain regions (and the corresponding extension regions) can be formed after formation of the either the sacrificial gate structure or spacer formation. Next, a dielectric material is provided that has an upper surface that is planar to each sacrificial gate structure. Then, each sacrificial gate structure can be replaced with a functional gate structure. Further details regarding such as process is now provided.

The term "sacrificial gate structure" is used throughout the present application to denote a material that serves as a placeholder structure for a functional gate structure to be subsequently formed. Each sacrificial gate structure can be formed by first providing a blanket layer of a sacrificial gate material on an uppermost surface of a substrate such as the one depicted in FIG. 5. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structures.

Next, an optional spacer can be formed on a sidewall of each sacrificial gate structure. The optional spacer can include one of the spacer materials mentioned above for spacer 30, and the optional spacer can be formed utilizing the technique mentioned above in forming spacer 30. Prior to of after spacer formation each source region 32S can be formed on one side of each sacrificial gate structure and each drain region 32D can be formed on another side of each sacrificial gate structure. Each source region 32S and each drain region 32D can be formed by ion implantation and annealing as mentioned above.

Next, a dielectric material 34 is formed and thereafter a gate cavity is provided by removing each sacrificial gate structure. Prior to forming the gate cavity, the dielectric material 34 has an uppermost surface that is coplanar with an uppermost surface of each sacrificial gate structure. As such, the uppermost surface of each sacrificial gate structure is exposed after forming the dielectric material 34.

The dielectric material 34 that is used in this embodiment of the present application may include, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 34. The use of a self-planarizing dielectric material as dielectric material 34 may avoid the need to perform a subsequent planarizing step.

In one embodiment, the dielectric material 34 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 34, a planarization process or an etch back process follows the deposition of the dielectric material. The thickness of the dielectric material 34 that can be employed in the present application may vary depending on the type of dielectric material employed as well as the method that was employed in forming the same. In one embodiment, the dielectric material 34 has a thickness from 80 nm to 500 nm. Other thicknesses that are greater or lesser than the range provided above can also be used for the dielectric material 34.

The gate cavities can be formed by removing each sacrificial gate structure that is contained in the dielectric material 34. Each sacrificial gate structure can be removed by etching. In one example, a reactive ion etch can be used to removal each sacrificial gate structure.

After forming the gate cavities, each gate cavity is filled with a gate dielectric material portion 26L, 26R and a gate conductor portion 28L, 28R. The gate dielectric material portion 26L, 26R and the gate conductor portion 38L, 28R provide a functional gate structure 24L, 24R within the area previously occupied by the sacrificial gate structure.

In some embodiments and as shown in the drawing, the gate dielectric material portion 26L, 26R is U-shaped having a bottommost portion in direct contact with an uppermost surface of a semiconductor material portion (i.e., strained silicon or relaxed silicon) and portions that are located on exposed sidewalls of each spacer, if present, or on exposed sidewalls of dielectric material 34. Within each gate cavity, the gate dielectric material portion 26L, 26R surrounds the gate conductor portion 28L, 28R. In another embodiment, the gate dielectric material portion 26L, 26R is not U-shaped and thus lacks the portions mentioned. In such an embodiment, the gate conductor portion 28L, 28R that is formed atop the non-U-shaped gate dielectric fills the remaining portion of the gate cavity and has outermost edges that directly contact a sidewall surface of each spacer, if present, or a sidewall surface of dielectric material 34.

The gate dielectric material portion 26L, 26R may comprise one of the gate dielectric materials mentioned above. Also, the gate dielectric material portion 26L, 26R may be formed utilizing one of the deposition techniques or thermal growth techniques mentioned above in forming gate dielectric material in the gate first embodiment.

The gate conductor portion 28L, 28R may comprise one of the metal gate conductive materials mentioned above in forming the conductive material in the gate first process. Also, the gate portion 28L, 28R may be formed utilizing one of the deposition techniques mentioned above in forming the conductive material in the gate first process.

The engineered substrate that is shown in FIG. 5 can also be used in forming non-planar semiconductor devices such as, for example, finFET and gate-all-around semiconductor nanowire devices. Such non-planar semiconductor devices can be formed utilizing any well known process that is capable of forming such devices.

Figure 8:
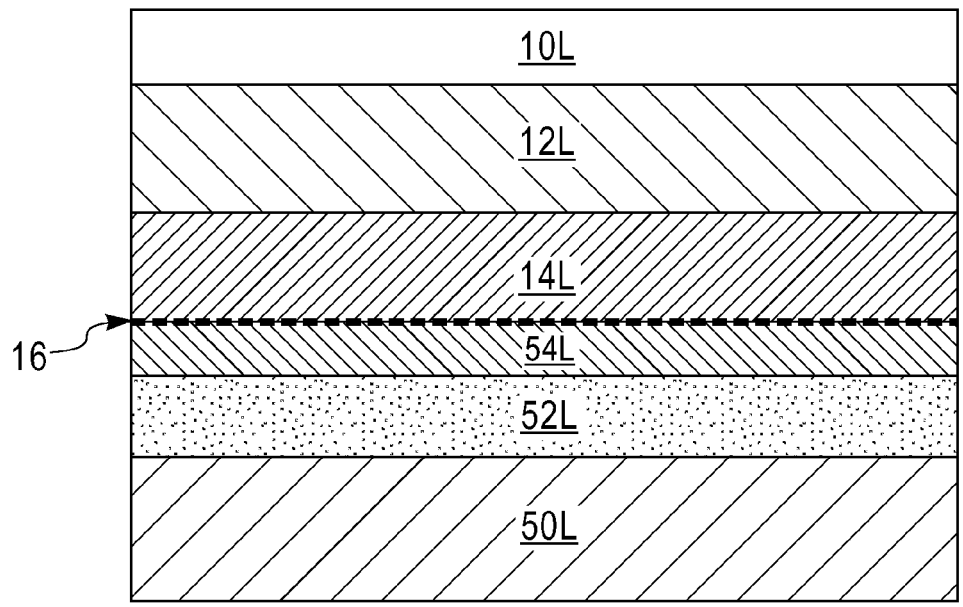
FIG. 8 is a cross sectional view of the exemplary semiconductor structure of FIG. 1 after bonding an exposed surface of the strained silicon material layer of the material stack to an exposed surface of a relaxed silicon material layer of a silicon-on-insulator substrate in accordance with another embodiment of the present application.

Referring now to FIG. 8, there is illustrated the exemplary semiconductor structure of FIG. 1 after bonding an exposed surface of the strained silicon material layer 14L of the material stack (10L, 12L, 14L) to an exposed surface of a relaxed silicon material layer 54L of a silicon-on-insulator substrate (50L, 52L, 54L) in accordance with another embodiment of the present application.

The silicon-on-insulator substrate that can be employed in this embodiment of the present application includes, from bottom to top, a handle substrate 50L, an insulator layer 52L and a relaxed silicon material layer 54L. The silicon-on-insulator substrate can be formed utilizing any technique that is well known to those skilled in the art including, for example, a layer transfer process.

The handle substrate 50L of the silicon-on-insulator substrate that can be employed in this embodiment of the present application may be any semiconductor material including, but not limited to, silicon, a silicon germanium alloy, germanium, and III-V compound semiconductors such as, for example, GaAs, InAs, GaP, and InP. The handle substrate 50L may be a single crystalline semiconductor material, a polycrystalline semiconductor material or an amorphous semiconductor material. The thickness of the handle substrate 50L of the silicon-on-insulator substrate is inconsequential to the present application.

The insulator layer 52L of the silicon-on-insulator substrate that can be employed in this embodiment of the present application may be any dielectric material having insulating properties such as, for example, an oxide, nitride and/or oxynitride. In one embodiment, the insulator layer 52L is comprised of silicon dioxide, boron nitride, boron oxynitride, and/or silicon nitride. The insulator layer 52L is a contiguous layer that covers the entirety of the underlying handle substrate 50L. The thickness of the insulator layer 52L may be from 1 nm to 200 nm, with a thickness from 100 nm to 150 nm being more typical.

The relaxed silicon material layer 54L of the silicon-on-insulator substrate of the present application is a contiguous layer that covers the entirety of the underlying insulator layer 52L. The thickness of the relaxed silicon material layer 54L may be from 10 nm to 100 nm.

The bonding of the exposed surface of the strained silicon material layer 14L of the material stack (10L, 12L, 14L) to the exposed surface of a relaxed silicon material layer 54L of the silicon-on-insulator substrate (50L, 52L, 54L) can be performed as described above in providing the bonded structure shown in FIG. 2 of the present application. In this embodiment of the present application, and similar to the embodiment depicted in FIG. 2, a defect containing region 16 forms during the bonding process. In this embodiment of the present application, and as shown in FIG. 8, the defect containing region is located at the bonded interface between the strained silicon material layer 14L of the material stack (10L, 12L, 14L) and the relaxed silicon material layer 54L of the silicon-on-insulator substrate (50L, 52L, 54L).

Figure 9:
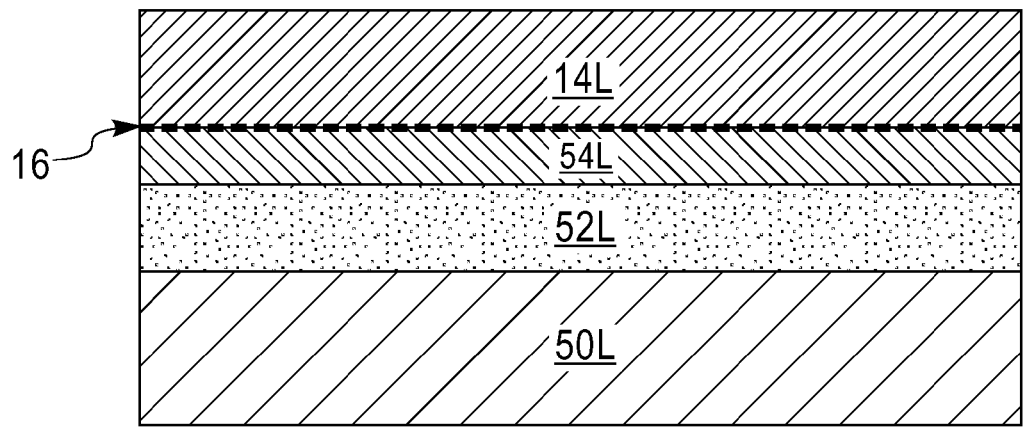
FIG. 9 is a cross sectional view of the exemplary semiconductor structure of FIG. 8 after removing the relaxed silicon material layer and the silicon germanium alloy material layer to expose a surface of the strained silicon material layer.

Referring now FIG. 9, there is illustrated the exemplary semiconductor structure of FIG. 8 after removing the relaxed silicon material layer 10L and the silicon germanium alloy material layer 14L to expose a surface of the strained silicon material layer 14L. The removal of the relaxed silicon material layer 10L and the silicon germanium alloy material layer 14L from the exemplary semiconductor structure of FIG. 8 can be performed utilizing one of the material removal techniques mentioned above in providing the exemplary semiconductor structure shown in FIG. 3 of the present application.

Figure 10:
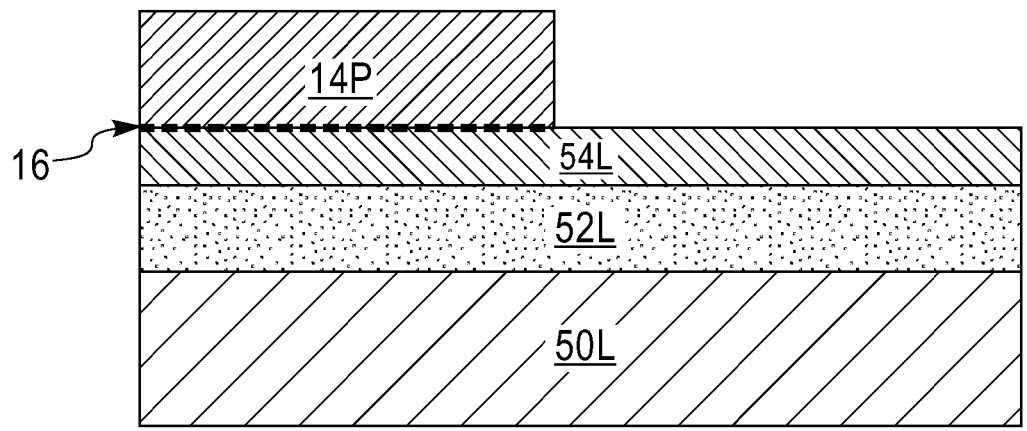
FIG. 10 is a cross sectional view of the exemplary semiconductor structure of FIG. 9 after entirely removing the strained silicon material layer from one region of the structure, but not another region of the structure.

Referring now to FIG. 10, there is illustrated the exemplary semiconductor structure of FIG. 9 after entirely removing the strained silicon material layer 14L and the defect containing region 16 from one region of the structure, but not another region of the structure. In the one region of the structure that the strained silicon material layer 14L and the defect containing region 16 are entirely removed, a surface of the relaxed silicon layer 54L of the silicon-on-insulator substrate is exposed. The remaining portion of the strain silicon material layer 14L in the area in which removal was not performed is now referred to as a strained silicon material layer portion 14P.

In one embodiment of the present application, a block mask (not shown) such as, for example, a photoresist material or oxide, can be formed protecting the strained silicon material layer 14L within one region of the structure, while leaving the strained silicon material layer 14L within the other region of the structure exposed (i.e., unprotected). An anisotropic etch can then be used to completely remove the exposed strained silicon material layer 14L within the one region of the structure. In one example, a KOH solution (e.g., 20 wt % KOH at a temperature from 65° C. to 80° C.) can be used to completely remove the exposed strained silicon material layer 14L within the one region of the structure. After the etch, the block mask can be removed utilizing techniques well known in the art providing the exemplary semiconductor structure shown in FIG. 10.

Figure 11:
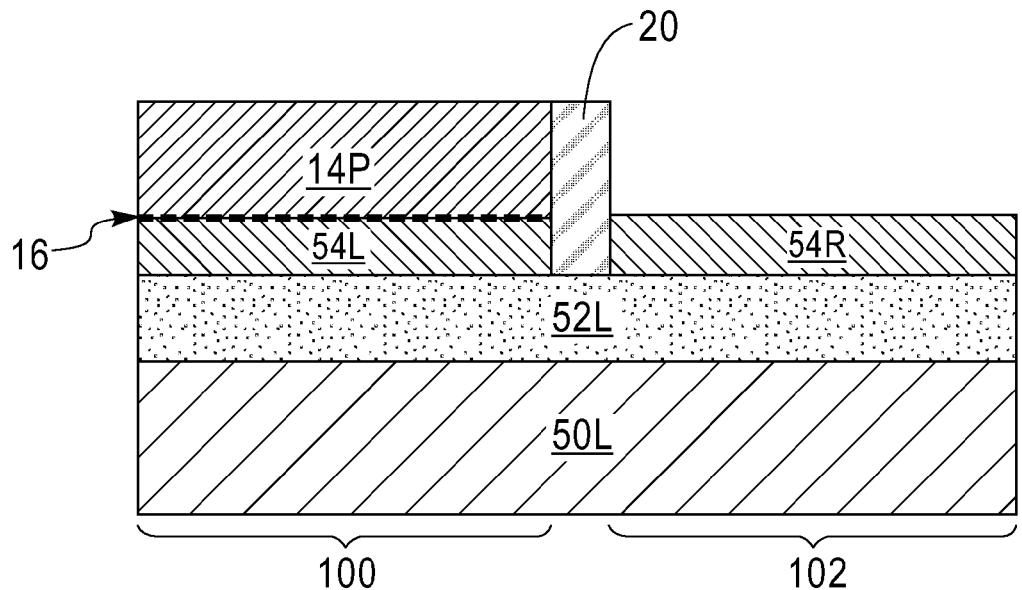
FIG. 11 is cross sectional view of the exemplary semiconductor structure of FIG. 10 after forming a trench isolation structure to define a first device region and a second device region.

Referring now to FIG. 11, there is illustrated the exemplary semiconductor structure of FIG. 10 after forming a trench isolation structure 20 to define a first device region 100 and a second device region 102. The trench isolation structure 20 of this embodiment of the present application can be formed utilizing the technique mentioned above in providing the trench isolation structure 20 shown in FIG. 4.

In this embodiment of the present application, the trench isolation structure 20 has a bottommost surface that directly contacts a surface of the insulator layer 52L and a topmost surface that is coplanar with the topmost surface of the strained silicon material layer portion 14P. Thus, the trench isolation structure 20 provides a relaxed nFET silicon material portion 54L and a laterally adjacent relaxed pFET silicon material portion 54L.

In some embodiments of the present application, the trench isolation structure 20 can be formed prior to removing the strained silicon material layer 14L from the one region of the structure.

Figure 12:
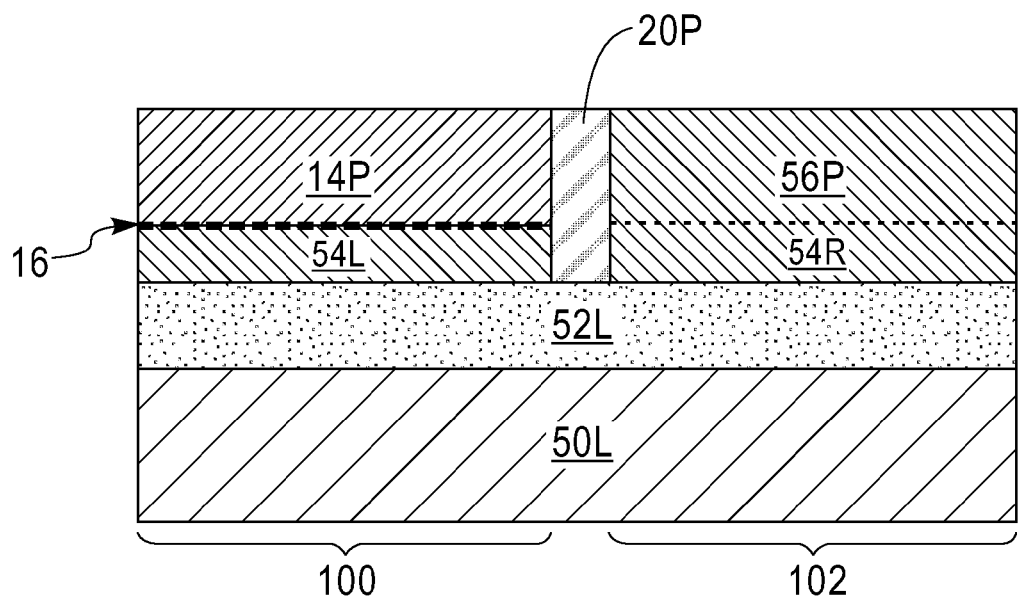
FIG. 12 is a cross sectional view of the exemplary semiconductor structure of FIG. 11 after providing a relaxed silicon material portion on an exposed surface of a relaxed pFET silicon material portion within the second device region.

Referring now FIG. 12, there is illustrated the exemplary semiconductor structure of FIG. 11 after providing a relaxed silicon material portion 56P on the exposed surface of the relaxed pFET silicon material portion 54R within the second device region 102. As is shown, the relaxed silicon material portion 56P has an uppermost surface that is coplanar with an uppermost surface of the trench isolation structure 20 and the strained silicon material layer portion 14P. As is also shown, the relaxed silicon material portion 56P has a bottommost surface that is coplanar with a bottommost surface of the strained silicon material layer portion 14P.

The relaxed silicon material portion 56P is formed utilizing an epitaxial growth, i.e., deposition, process, such as mentioned above in providing the relaxed silicon material portion 22P shown in FIG. 5 of the present application. Since an epitaxial growth process is used, the relaxed silicon material portion 52P has an epitaxial relationship, i.e., same crystal orientation, with the underlying semiconductor material layer, i.e., the relaxed pFET silicon material portion 54R within the second device region 102. Moreover, since the relaxed silicon portion 56P and the relaxed pFET silicon material portion 54R are each composed of silicon, no material interface is formed between the two materials. In the drawings, the dotted line between the relaxed silicon material portion 56P and the relaxed pFET silicon material portion 54R is merely provided for illustrative purposes. It is noted that strained silicon material layer portion 14P within the first device region 100 does not have an epitaxial relationship with that of the relaxed nFET silicon material portion 54L.

In some embodiments of the present application, and following the epitaxial growth of the relaxed silicon material portion 56P, a planarization process such as, for example, chemical mechanical planarization and/or grinding may be used to provide the planar structure illustrated in FIG. 12.

FIG. 12 shows a semiconductor structure in accordance with a further embodiment of the present application. The structure includes a relaxed silicon material layer (i.e., the relaxed nFET silicon material portion 54L and the relaxed pFET silicon material portion 54R) containing a first device region 100 and a second device region 102, wherein the first device region 100 is separated from the second device region 102 by a trench isolation structure 20. A strained silicon material layer portion 14P is located on a first portion of the relaxed silicon material layer (i.e., the relaxed silicon material portion 54L) in the first device region 100, wherein a defect containing region 16 is present at an interface between the strained silicon material layer portion 14P and the first portion of the relaxed silicon material layer (i.e., the relaxed nFET silicon material portion 54L). A relaxed silicon material portion 56P is located on a second portion of the relaxed silicon material layer (i.e., the relaxed pFET silicon material portion) in the second device region 102, wherein the relaxed silicon material portion 56P has an epitaxial relationship with the second portion of the relaxed silicon material layer (i.e., 54R) and no defect containing region is present between the relaxed silicon material portion 56P and the second portion of the relaxed silicon material layer (i.e., 54R).

Figure 13:
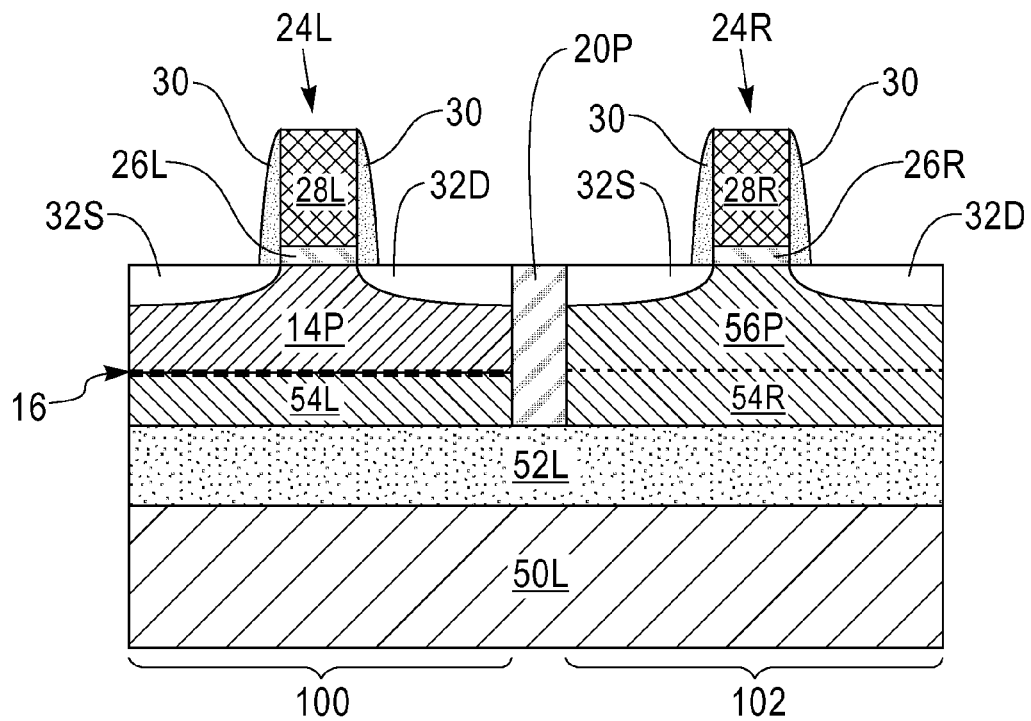
FIG. 13 is a cross sectional view of the exemplary semiconductor structure of FIG. 12 after forming an nFET device within the first device region and on a strained silicon material layer portion, and forming a pFET device within the second device region and on the relaxed pFET silicon material portion using a gate first process.

Referring now to FIG. 13, there is illustrated the exemplary semiconductor structure of FIG. 12 after forming an nFET device 24L within the first device region 100 and on the strained silicon material layer portion 14P, and forming a pFET device 24R within the second device region 102 and on the relaxed silicon material portion 56P using a gate first process. The various elements shown in FIG. 13 are the same as those described above in forming the structure shown in FIG. 6 of the present application. As such, the description provided for each element shown in FIG. 6 is applicable here for providing each of the elements shown in FIG. 13. Although a pFET device is described and illustrated as being formed in the second device region 102, it is possible to form a low leakage nFET device on the relaxed silicon material portion 56P and in the second device region 102.

Figure 14:
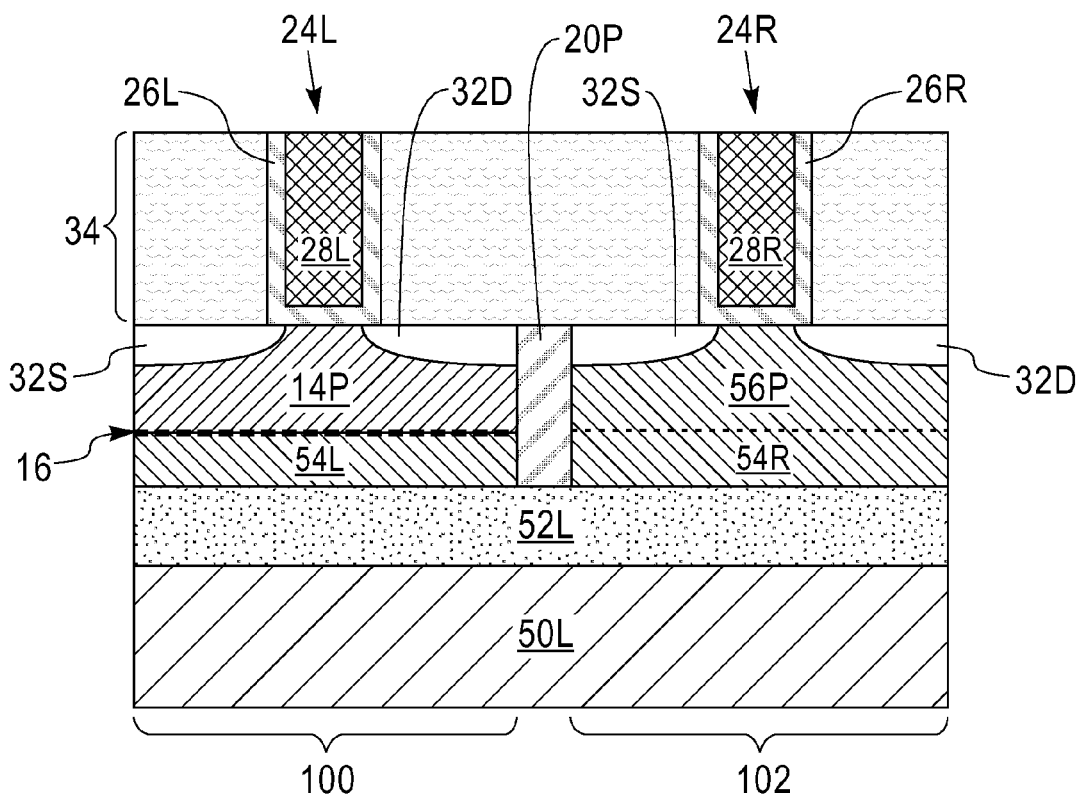
FIG. 14 is a cross sectional view of the exemplary semiconductor structure of FIG. 12 after forming an nFET device within the first device region and on a strained silicon material layer portion, and forming a pFET device within the second device region and on the relaxed pFET silicon material portion using a gate last process.

Referring now to FIG. 14, there is illustrated the exemplary semiconductor structure of FIG. 12 after forming an nFET device 24L within the first device region 100 and on a strained silicon material layer portion 14P, and forming a pFET device 24R within the second device region and on the relaxed silicon material portion 56P using a gate last process. The various elements shown in FIG. 14 are the same as those described above in forming the structure shown in FIG. 7 of the present application. As such, the description provided for each element shown in FIG. 7 is applicable here for providing each of the elements shown in FIG. 14. Although a pFET device is described and illustrated as being formed in the second device region 102, it is possible to form a low leakage nFET device on the relaxed silicon material portion 56P and in the second device region 102.

The engineered substrate that is shown in FIG. 12 can also be used in forming non-planar semiconductor devices such as, for example, finFET and gate-all-around semiconductor nanowire devices. Such non-planar semiconductor devices can be formed utilizing any well known process that is capable of forming such devices.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
  bonding an exposed surface of a strained silicon material layer to an exposed surface of a relaxed silicon material layer, wherein after bonding a defect containing region is present at an interface between said strained silicon material layer and said relaxed silicon material layer;
  completely removing said strained silicon material layer and said defect containing region formed during bonding from one device region, while a portion of said strained silicon material layer and said defect containing region remains in another device region; and
  epitaxially growing a relaxed silicon material portion on an exposed portion of said relaxed silicon material layer in said one device region.

2. The method of claim 1, wherein strained silicon material layer is a component of a material stack, and said material stack further comprises a relaxed silicon germanium alloy material layer having a surface in direct physical contact with another surface of said strained silicon material layer that is opposite said exposed surface of said strained silicon material layer, and another relaxed silicon material layer having a surface in direct physical contact with another surface of said relaxed silicon germanium alloy material layer that is opposite said surface of said relaxed silicon germanium alloy material layer that is in direct physical contact with said another surface of said strained silicon material layer.

3. The method of claim 2, further comprising removing said relaxed silicon germanium alloy material layer and said another relaxed silicon material layer from each device region, wherein said removing of said relaxed silicon germanium alloy material layer and said another relaxed silicon material layer is performed after bonding and prior to said completing removing said strained silicon material and said defect containing region from said one device region.

4. The method of claim 3, wherein said completely removing said strained silicon material layer and said defect containing region formed during bonding from one device region, further removes an upper portion of said relaxed silicon material layer to expose a sub-surface portion of said relaxed silicon material layer in said one device region.

5. The method of claim 4, wherein said relaxed silicon material portion has a bottommost surface that is vertically offset and located below a bottommost surface of said portion of said strained silicon material layer in said another device region.

6. The method of claim 1, further comprising forming a trench isolation structure into said strained silicon material layer and said relaxed silicon material layer, wherein said forming said trench isolation structure is performed after bonding and prior to said completing removing said strained silicon material and said defect containing region from said one device region.

7. The method of claim 2, further comprising forming at least first field effect transistor (FET) device in said another device region and on said remaining portion of said strained silicon material layer, and forming a second FET device that differs from said first FET device in said one device region and on said relaxed silicon material portion.

8. The method of claim 3, wherein said relaxed silicon material layer is a component of a silicon-on-insulator substrate, said silicon-on-insulator substrate further comprises an insulator located directly beneath said relaxed semiconductor material layer, and a handle substrate located directly beneath said insulator layer.

9. The method of claim 8, wherein said completely removing said strained silicon material layer and said defect containing region formed during bonding from one device region stops on an uppermost surface of said relaxed silicon material layer in said one device region.

10. The method of claim 9, further comprising forming a trench isolation region having a bottommost surface in direct contact with a surface of said insulator layer, wherein said trench isolation structure divides said relaxed silicon material layer into a relaxed nFET silicon material portion in said at least another device region and a relaxed pFET silicon material portion in said one device region.

11. The method of claim 10, wherein said portion of said strained silicon material layer in said another device region has a bottommost surface that is coplanar with a bottommost surface of said relaxed silicon material portion.

12. A semiconductor structure comprising:
a relaxed silicon material layer containing a first device region and a second device region, wherein said first device region is separated from said second device region by a trench isolation structure;
a strained silicon material layer portion located on a first portion of said relaxed silicon material layer in said first device region, wherein a defect containing region is present at an interface between said strained silicon material layer portion and said first portion of said relaxed silicon material layer; and
a relaxed silicon material portion located on a second portion of said relaxed silicon material layer in said second device region, wherein said relaxed silicon material portion has an epitaxial relationship with said second portion of said relaxed silicon material layer and no defect containing region is present between said relaxed silicon material portion and said second portion of said relaxed silicon material layer.

13. The semiconductor structure of claim 12, wherein said relaxed silicon material layer in said first device region comprises a relaxed nFET silicon material portion and said relaxed silicon material layer in said second device region comprises a relaxed pFET silicon material portion.

14. The semiconductor structure of claim 13, wherein said relaxed nFET silicon material portion and said relaxed pFET silicon material portion are separated from each other by a bottom portion of said trench isolation structure.

15. The semiconductor structure of claim 14, further comprising an insulator layer located directly beneath each of said relaxed nFET silicon material portion and said relaxed pFET silicon material portion, and a handle substrate located directly beneath said insulator layer.

16. The semiconductor structure of claim 15, wherein a bottommost surface of said strained silicon material layer portion is coplanar with a bottommost surface of said relaxed silicon material portion, and wherein a topmost of said strained silicon material layer portion is coplanar with a topmost surface of said relaxed silicon material portion.

17. The semiconductor structure of claim 16, further comprising an nFET located on said strained silicon material layer portion and in said first device region, and a pFET or a leakage nFET located on said relaxed silicon material portion in said second device region.

18. The semiconductor structure of claim 12, wherein a bottommost surface of said relaxed silicon material portion is vertically offset and located below a bottommost surface of said strained silicon material layer portion, and wherein a topmost of said strained silicon material layer portion is coplanar with a topmost surface of said relaxed silicon material portion.

19. The semiconductor structure of claim 18, further comprising an nFET located on said strained silicon material layer portion and in said first device region, and a pFET or a leakage nFET located on said relaxed silicon material portion in said second device region.

20. The semiconductor structure of claim 18, wherein a bottom portion of said trench isolation structure extends into a portion of said relaxed silicon material layer.

* * * * *